United States Patent
Starovecky et al.

(10) Patent No.: US 9,472,687 B2
(45) Date of Patent: Oct. 18, 2016

(54) SCHOTTKY DIODE AND METHOD FOR MAKING IT

(75) Inventors: Stefan Starovecky, Piestany (SK); Olga Krempaska, Piestany (SK); Martin Predmersky, Piestany (SK)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 13/435,221

(22) Filed: Mar. 30, 2012

(65) Prior Publication Data
US 2012/0256288 A1    Oct. 11, 2012

(30) Foreign Application Priority Data
Mar. 31, 2011 (DE) .............. 10 2011 006 492

(51) Int. Cl.
| | |
|---|---|
| H01L 21/265 | (2006.01) |
| H01L 21/44 | (2006.01) |
| H01L 21/18 | (2006.01) |
| H01L 29/872 | (2006.01) |
| H01L 29/06 | (2006.01) |
| H01L 29/47 | (2006.01) |

(52) U.S. Cl.
CPC ......... H01L 29/872 (2013.01); H01L 29/0657 (2013.01); H01L 29/47 (2013.01)

(58) Field of Classification Search
CPC ...... H01L 21/265; H01L 21/44; H01L 21/18
USPC ............. 257/104, 9, 471, 607, E29.332, 257/E29.226, E29.339, E21.003, E21.053; 438/979, 983
See application file for complete search history.

(56) References Cited

U.S. PATENT DOCUMENTS

| | | | |
|---|---|---|---|
| 3,500,144 A * | 3/1970 | Wetterau, Jr. et al. | ....... 257/785 |
| 4,398,344 A | 8/1983 | Gould | |
| 4,816,879 A * | 3/1989 | Ellwanger | ......... H01L 21/28537 257/475 |

(Continued)

FOREIGN PATENT DOCUMENTS

| | | |
|---|---|---|
| DE | 195 44 326 | 6/1997 |
| DE | 69 226 783 | 4/1999 |

(Continued)

OTHER PUBLICATIONS

EPO Search Report Jul. 6, 2012.
(Continued)

*Primary Examiner* — David Vu
*Assistant Examiner* — Mouloucoulaye Inoussa
(74) *Attorney, Agent, or Firm* — The Law Offices of Roger S. Thompson

(57) ABSTRACT

A Schottky diode and a method for making one. The method includes the following steps: providing a semiconductor base body, preferably in the form of a wafer, having a high dopant concentration and having a first main surface, which forms the first electrical contact surface of the Schottky diode; epitaxially depositing a semiconductor layer having the same conductivity and a lower dopant concentration on that surface of the semiconductor base body which lies opposite the first main surface; arranging a first metal layer on the semiconductor layer with the formation of a Schottky contact between the first metal layer and the semiconductor layer; connecting a planar contact body to the first metal layer by means of a connecting means; forming at least one individual Schottky diode; and arranging a passivation layer in the edge region of the at least one Schottky diode.

17 Claims, 3 Drawing Sheets

(56) References Cited

U.S. PATENT DOCUMENTS

| | | | |
|---|---|---|---|
| 4,916,716 A * | 4/1990 | Fenner et al. | 257/480 |
| 5,135,878 A * | 8/1992 | Bartur | 438/106 |
| 5,686,753 A * | 11/1997 | Miyata | H01L 29/872 |
| | | | 257/109 |
| 7,791,136 B1 | 9/2010 | Hsieh | |
| 2005/0269573 A1* | 12/2005 | Seng et al. | 257/77 |
| 2007/0287276 A1* | 12/2007 | Drobny | 438/570 |
| 2009/0309181 A1* | 12/2009 | Hsieh | H01L 29/0611 |
| | | | 257/471 |

FOREIGN PATENT DOCUMENTS

| | | |
|---|---|---|
| EP | 0 054 655 A2 | 7/1982 |
| JP | 2004 207418 | 7/2004 |
| JP | 2008 210938 | 9/2008 |
| WO | WO 93 11 562 | 6/1993 |
| WO | WO 97/20350 | 6/1997 |

OTHER PUBLICATIONS

EPO Office Action dated Jul. 14, 2014.

* cited by examiner

SCHOTTKY DIODE AND METHOD FOR MAKING IT

BACKGROUND OF THE INVENTION

1. Field of the Invention

The invention is directed to a bulk-conductive Schottky diode and a method for producing such a diode, and, more particularly, a method for producing a plurality of substantially identical such diodes in a wafer assemblage.

2. Description of the Related Art

Schottky diodes have long been known in principle, for example from European Published Patent EP 0 054 655 A2 or U.S. Pat. No. 4,398,344. What is advantageous in principle about Schottky diodes, specifically those which consist of a compound semiconductor material, in comparison to semiconductor diodes having a pn junction, is their particularly fast switching behavior, that is to say the possibility of being able to undergo transition from forward to reverse operation at a high frequency. For this reason, Schottky diodes, including already those based on silicon, are particularly suitable as protective diodes in a wide variety of applications.

A further essential advantage of Schottky diodes is that they have a lower voltage drop in the forward direction compared to other devices. This advantage is significant, for example when used as a protective diode in photovoltaic installations.

There is a need, however, for Schottky diodes having improved characteristics.

SUMMARY OF THE INVENTION

It is an object of the invention to provide an improved, mechanically robust, Schottky diode, and also an associated production method, which allows fast switching even at relatively high voltages and currents.

The invention is directed to a Schottky diode having a first and a second main surface and an edge surface. As viewed proceeding from the first main surface, the inventive Schottky diode has a layered construction, wherein the layers need not have the same thickness, but all are oriented substantially parallel to one another.

The first layer adjacent to the first main surface of the inventive Schottky diode is a semiconductor base body having a first, high, dopant concentration, which leads to a high conductivity of the layer. A semiconductor layer having the same conductivity as that of the base body is adjacent to the base body on its side facing away from the first main surface. However, this semiconductor layer has a dopant concentration which is orders of magnitude lower than that of the first layer.

A first metal layer is arranged on the semiconductor layer, wherein the Schottky contact is formed at the interface between the first metal layer and the semiconductor layer. Preferably, a second metal layer embodied as a migration barrier is arranged adjacent to the first metal layer. This second metal layer is preferably formed from titanium, for example, and prevents metal atoms from penetrating through this layer into the first metal layer, where such metal atoms could interfere with the operation of the Schottky contact.

There is arranged on the first or, if it is present, second, metal layer a layer composed of a connecting means, which serves for connecting the metal layer (whether first or second) to a planar contact body. In this case, the contact body can consist of a metal or a highly-doped semiconductor material. The assigned connecting means is preferably embodied as a mono- or multi-layered further metal layer or as a conductive adhesive connection. That main surface of the contact body which faces away from the connecting means forms a second main surface of the Schottky diode.

The edge surface of the Schottky diode can be oriented transversely to, and preferably generally perpendicularly to, the layers, specifically the at least one metal layer. However, particularly in the case of Schottky diodes for high voltages, at least in that region of the edge surface at which the Schottky contact abuts the latter, it may be preferred if the edge surface forms an angle with the layers which deviates from a right angle by more than about 5 degrees.

Furthermore, according to a preferred embodiment of the invention, a passivation layer completely or partly covering the edge surface of the Schottky diode is provided. In the case of only partial coverage, at least that portion of the edge region around the Schottky contact, that is to say both below and above the latter, should be covered. In the case of complete coverage, the passivation layer extends from the first to the second main surface of the Schottky diode.

In accordance with the inventive configuration, the main surfaces of the Schottky diode simultaneously form respective first and second electrical contact surfaces. In this case it may be preferred if a further metallic contact layer is provided on at least one of the contact surfaces. Particularly if the contact body is not made of metal, it may be necessary, in order to be able to externally connect the Schottky diode, to provide a further metallic contact layer there, which can also be embodied as a multilayer contact.

The method according to the invention for producing at least one bulk-conductive Schottky diode of this type is characterized by the following method:

Providing a semiconductor base body having a high dopant concentration, so that the conduction losses during passage of current therethrough are minimized. A first main surface of the semiconductor base body also forms the first electrical contact surface of the Schottky diode, once completed. It is, of course, preferred and generally known from the prior art, for a plurality of Schottky diodes to be produced substantially simultaneously in the context of the method. For this purpose, the semiconductor base body is present in the form of a wafer, from which the individual Schottky diodes are then singulated.

A semiconductor layer having the same conductivity as the semiconductor base body but a lower dopant concentration, which is necessary for the formation of a Schottky contact, is subsequently deposited epitaxially on that surface of the semiconductor base body which lies opposite the first main surface.

Arranging a first metal layer on the semiconductor layer, thereby forming the Schottky contact between the first metal layer and the semiconductor layer.

Preferably, arranging a second metal layer as a migration barrier on the first metal layer. For both metal layers, it may be preferred to apply them in a vapor deposition method, a sputtering method or a deposition method from the liquid phase, wherein the methods of applying each metal layer may differ.

In a further step, a planar contact body is connected to the first, or if present, the second, metal layer by means of a connecting means. For this connection, too, various known methods such as adhesive-bonding, soldering or sintering methods may be advantageous.

After these method steps that are advantageously applied previously to the entire wafer, individual Schottky diodes are formed in the next step. For this purpose, it may be advantageous to arrange the wafer on a carrier device, particularly preferably embodied as an expandable film.

The formation of at least one Schottky diode, preferably the singulation of a plurality of Schottky diodes from the wafer assemblage, is effected by sawing, whereby the horizontal extent and hence the current-carrying capacity of the respective individual Schottky diode are also defined. It may be preferred for the sawing to be performed as a one- or two-stage method, wherein in each case subsequently during the singulation from the wafer assemblage, the individual Schottky diodes can still be present in the loose assemblage carried on the carrier device.

Particularly in the case of a two-stage sawing method it is easily possible, at least in the region of the Schottky contact, to form the edge surface in such a way that there it forms an angle with the layers, in particular the at least one metal layer, which deviates from a right angle by more than about 5 degrees.

After the sawing method, it is furthermore advantageous to subject the edge region at least in the region of the Schottky contact to etching, to remove possible defects produced by the sawing.

In a further method step, a passivation layer is arranged either on the entire edge surface or at least on that portion thereof around the Schottky contact. After that, if appropriate, the loose assemblage of the individual Schottky diodes is broken up and the Schottky diodes are completely singulated.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
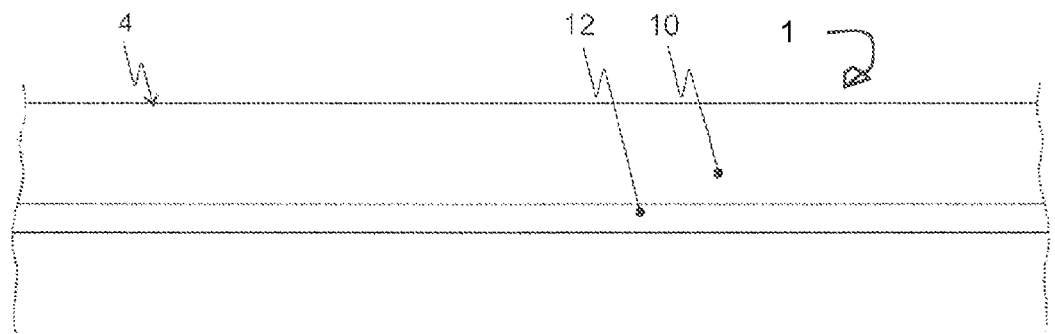
FIGS. 1 to 7 show steps of the inventive method for producing a Schottky diode.
Figure 8:
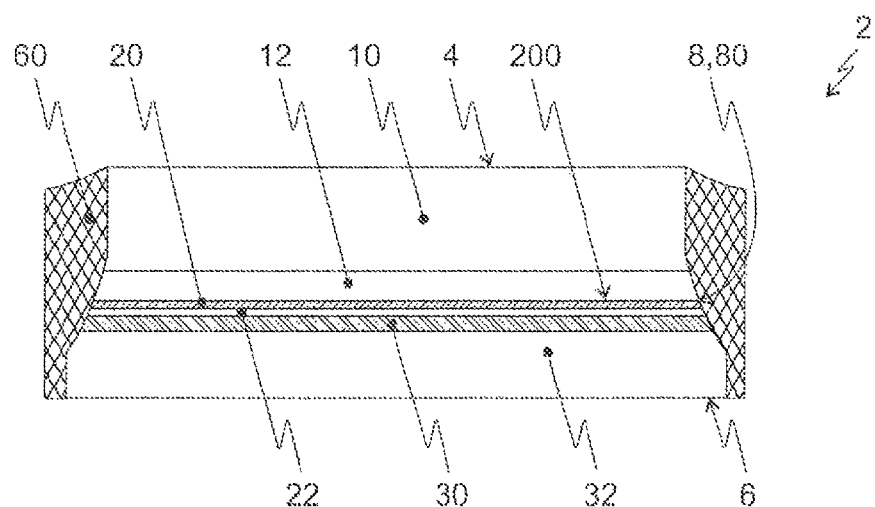
FIG. 8 shows a Schottky diode manufactured in accordance with the inventive method.

FIG. 1 shows an excerpt from a wafer 1 that forms a semiconductor base body 10 of a plurality of Schottky diodes 2 (FIG. 8). Semiconductor base body 10 is preferably composed of monocrystalline silicon, and has a high concentration of dopants, such that it has a resistivity of less than one milliohm per centimeter, and hence a high conductivity. Preferably, semiconductor base body 10 has an n-type doping with an associated conductivity. A preferred thickness of semiconductor base body 10 is between about 80 μm and about 150 μm, wherein thicker semiconductor base bodies, for example having a thickness of between about 200 μm and about 300 μm, are also likewise suitable in principle. In this case, a first main surface 4 of semiconductor base body 10 forms a first contact surface of Schottky diode 2 after singulation.

An epitaxially deposited semiconductor layer 12 having the same conductivity as that of semiconductor base body 10 but a low dopant concentration is illustrated on semiconductor base body 10. Semiconductor layer 12 has a thickness of about a few micrometers and a resistivity of the order of magnitude of one ohm per centimeter.

Figure 2:
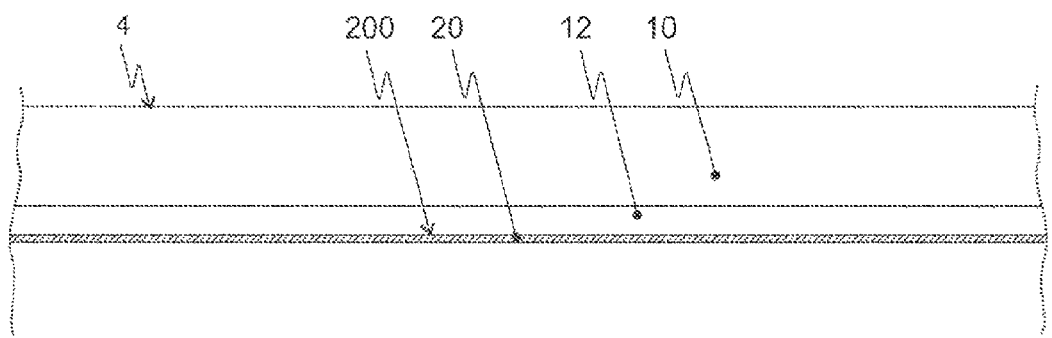

FIG. 2 shows a first metal layer 20 arranged on semiconductor layer 12, first metal layer 20 forming at its interface with semiconductor layer 10, a Schottky contact and hence providing the fundamental functionality of the Schottky diode. First metal layer 20 is deposited by known methods, such as by sputtering, and is preferably subsequently heat-treated.

Figure 3:
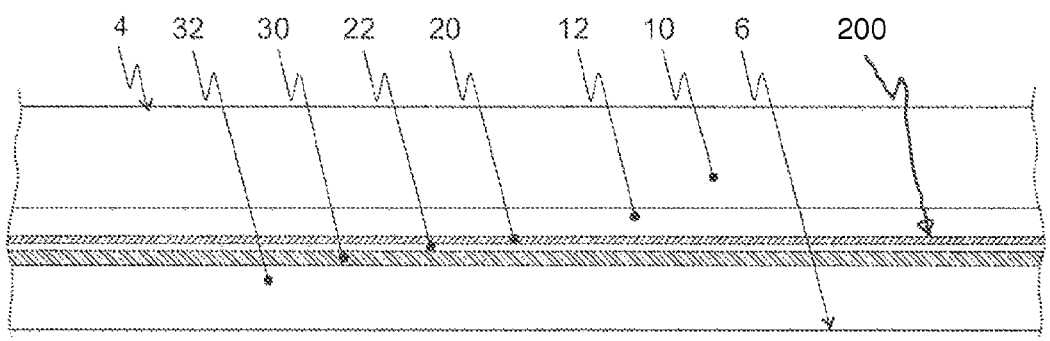

FIG. 3 shows, arranged in this order from first metal layer 20 onwards, a second metal layer 22, a connecting means 30 and a planar contact body 32. After singulation, contact body 32 forms, with its main surface facing away from connecting means 30, a second contact surface 6 of Schottky diode 2. Planar contact body 32 is preferably formed of metal or a highly doped semiconductor material, for example the same material of which the semiconductor base body is made. The primary task of contact body 32 is to provide first metal layer 20 with external electrical connections, that is to say ultimately to a Schottky contact 200. For this purpose, contact body 32 also has a preferred thickness of between about 100 μm and about 200 μm.

Connecting means 30 electrically conductively connects to planar contact body 32 and provides mechanically stability in fixing thereto. For this purpose, connecting means 30 has properties adapted to the configuration of contact body 32. For example in the case of a contact body consisting of molybdenum, it may be preferred for connecting means 30 to be embodied as a solder layer. If the requirements made of the connection are more stringent, a sintering metal layer can also be involved, which is then combined with further noble metal layers, for example on contact body 32, thus resulting in a multilayered configuration of connecting means 30.

Where planar contact body 32 is formed of a semiconductor material, it may be preferred for connecting means 30 to be an adhesive connection.

In principle, a second metal layer 22 is furthermore provided between first metal layer 20 and connecting means 30, second metal layer 22 serving as a migration barrier to prevent penetration of atoms, in particular metal atoms, for example from connecting means 30 or planar contact body 32, into first metal layer 32. Forming second metal layer 22 of titanium is particularly preferred for this purpose.

It may also be preferred to provide further metallic contact layers on the first and/or second main surface in a next step (not illustrated). Such a contact layer on the first main surface serves, for example, for the electrically conductive soldering or sintering connection to a substrate or some other carrier of Schottky diode 2. A contact layer on the second main surface likewise serves for suitable electrically conductive connection to an external connection element.

Figure 4:
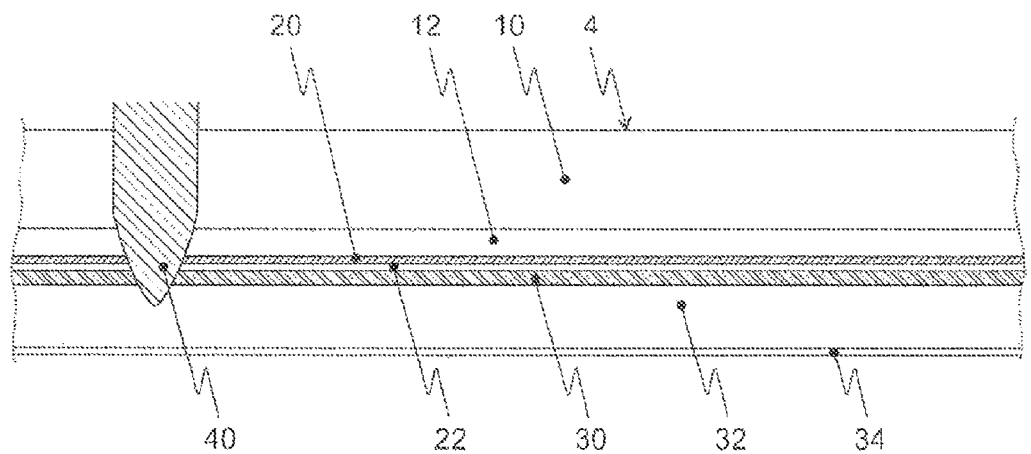

FIG. 4 illustrates a first sawing cut 40 which singulates the Schottky diodes partly but not yet completely. Here, a carrier device 34, for example a carrier film known in wafer handling, is already arranged on the second main surface 6, that is to say the free surface of planar contact body 32. Carrier film 34 principally serves to ensure that, after the sawing is completed, Schottky diodes 2 then present still remain arranged in a loose assemblage and are jointly accessible to further process steps.

An edge surface 8 (FIG. 5) of Schottky diode 2 already partly arises as a result of this first sawing step. Edge surface 8 is generally transverse to, and preferably substantially perpendicular to, the layers of Schottky diode 2. With the illustrated sawing apparatus with a V-shaped saw blade, an angle 80 with respect to the metal layers which deviates from a right angle by more than about 5 degrees, preferably about 10 degrees, is formed in the portion of the edge surface 8 around Schottky contact 200. For this purpose, the first sawing cut extends from the semiconductor base body right into planar contact body 32.

Figure 5:
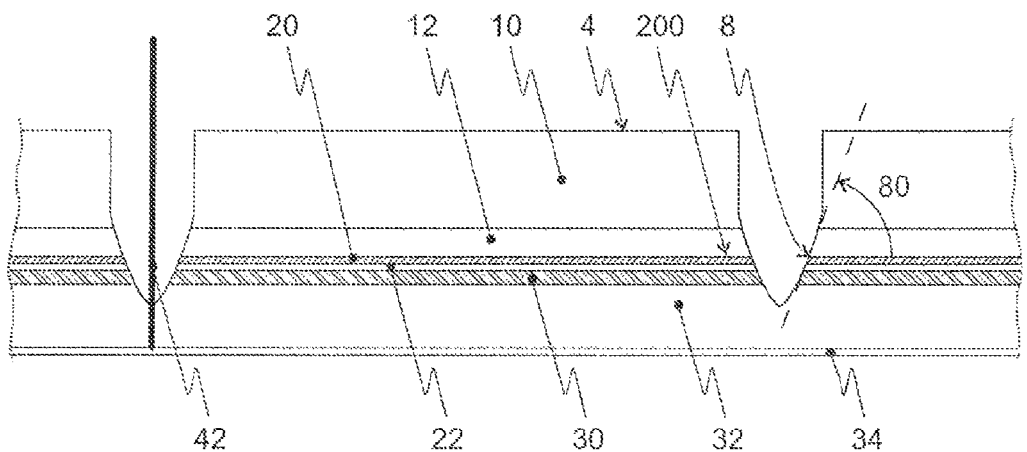

FIG. 5 also shows a second sawing cut, by means of which the Schottky diodes are completely singulated, but still remain in the loose assemblage by means of carrier film 34. The second sawing cut is effected centrally in the cutout produced by the first sawing cut by means of a sawing apparatus 42 of thinner design in comparison with the first sawing cut. Consequently, an above-described angle of edge surface 8 is maintained in a portion of the edge surface around Schottky contact 200. The provision of contact body 32 is also useful in forming angle 80 by means of the sawing method mentioned. The advantage of this configuration of edge surface 8 resides in the higher physical breakdown strength of the resultant Schottky diode.

Figure 6:
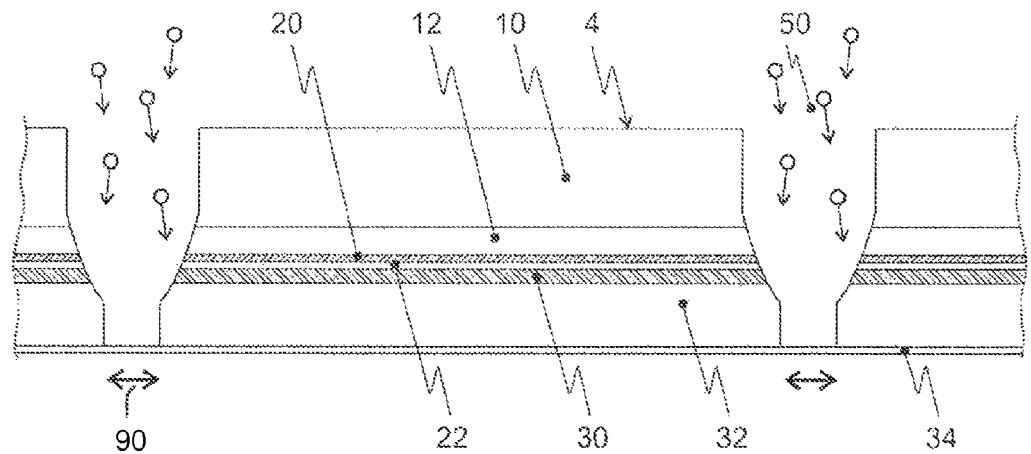

FIG. 6 shows singulated Schottky diodes in the loose assemblage by means of the carrier film, wherein here the distance between the Schottky diodes was enlarged by virtue of the fact that the film was expanded in two orthogonal directions, indicated one-dimensionally by double-headed arrow 90.

The illustration likewise shows an advantageous method step in which the edge surfaces of the Schottky diodes which are formed by sawing are treated in an etching method (shown figuratively as 50). In this case, it is preferred to use a reactive ion etching method. It is likewise possible to effect wet-chemical etching. In both methods it may additionally be advantageous to cover the first main surface and thus protect it against the etching medium.

By means of the etching method, in which a few micrometers of the edge surface are removed, any defect caused there by the sawing is removed.

Figure 7:
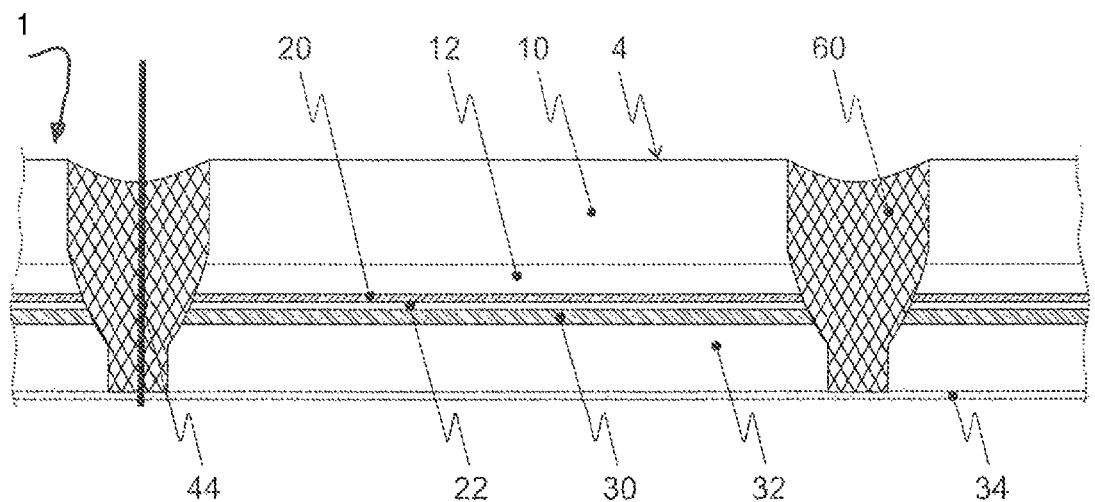

FIG. 7 shows the cutouts of wafer 1 that were produced by sawing, filled with a passivating, organic insulation material 60. The insulation material extends here from the first to the second main surface and thus covers the entire edge surface of the Schottky diodes.

The illustration likewise shows a concluding complete singulation of the Schottky diodes from the loose assemblage by means of a separation centrally through the insulation material.

FIG. 8 shows an individual Schottky diode according to the invention comprising a layered construction composed of the following layers arranged substantially in parallel: semiconductor base body 10, semiconductor layer 12, first metal layer 20, second preferred metal layer 22, connecting means 30 and planar contact body 32. Schottky contact 200 is in this case formed between semiconductor layer 12 and first metal layer 20.

This layer construction has an edge surface 8 completely enclosed with a passivation layer 60 consisting of an organic insulation material.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A Schottky diode comprising:
  a semiconductor base body with a first, high, dopant concentration, one side of said semiconductor base body forming a first main surface of the Schottky diode and thereby providing a first electrical contact surface therefor;
  a semiconductor layer adjacent to said semiconductor base body on a side thereof which is opposite to said first main surface of the Schottky diode, said semiconductor layer having the same conductivity as said semiconductor base body with a lower dopant concentration than said semiconductor base body;
  a first metal layer forming a Schottky contact with said semiconductor layer;
  a second metal layer in contact with said first metal layer, on a side of said first metal layer opposite to said Schottky contact;
  a layer including a connecting means and a planar contact body connected to said second metal layer;
  said layer also forming a second main surface of the Schottky diode and thereby providing a second electrical contact therefor;
  an edge surface extending generally transverse to the Schottky diode in contact with said Schottky contact, and forming an angle with at least said semiconductor layer, said first metal layer, said second metal layer and said layer including a connecting means, which angle deviates from a right angle by more than about 5 degrees at least in the region of the Schottky contact; and
  a passivation layer on said edge surface which covers at least that portion of said edge surface around said Schottky contact.

2. The Schottky diode of claim 1, wherein
said second metal layer forms a migration barrier between said first metal layer and said layer including said connecting means.

3. The Schottky diode of claim 1, wherein
said planar contact body is formed of a metallic material.

4. The Schottky diode of claim 1, wherein
said planar contact body is formed of a highly doped semiconductor material.

5. The Schottky diode of claim 1, wherein
said connecting means is a further metal layer.

6. The Schottky diode of claim 1, wherein
said connecting means is a conductive adhesive connection.

7. The Schottky diode of claim 1, wherein
further metallic contact layers are provided on at least one of said first and second main surfaces.

8. The Schottky diode of claim 1, wherein
said passivation layer covers said edge surface substantially completely, extending from said first main surface of the Schottky diode to said second main surface thereof.

9. A method for producing at least one Schottky diode, the method comprising the following steps:
providing a semiconductor base body having a high dopant concentration and having a first main surface, which forms a first electrical contact surface;
epitaxially depositing a semiconductor layer having the same conductivity as said semiconductor base body, and a lower dopant concentration than said semiconductor base body, on that surface of said semiconductor base body which lies opposite said first main surface thereof;
arranging a first metal layer on said semiconductor layer thereby forming a Schottky contact between said first metal layer and said semiconductor layer;
connecting a planar contact body to said first metal layer by means of a connecting means;
forming at least one individual Schottky diode;
arranging an edge surface extending generally transverse to the Schottky diode in contact with said Schottky contact, and forming an angle with at least said semiconductor layer, said first metal layer, said second metal layer and said layer including a connecting means, which angle deviates from a right angle by more than about 5 degrees at least in the region of the Schottky contact; and
arranging a passivation layer at least in said edge region of said at least one Schottky diode.

10. The method of claim 9, wherein
said first metal layer is applied in one of a vapor deposition method, a sputtering method and a deposition method from the liquid phase.

11. The method of claim 9, wherein
said planar contact body is connected to said first metal layer by means of one of adhesive-bonding, soldering and sintering.

12. The method of claim 9, wherein
a second metal layer is arranged between said first metal layer and said connecting means, and is applied by one of vapor deposition, sputtering method and deposition from the liquid phase.

13. The method of claim 12, wherein
said planar contact body is connected to said second metal layer by one of adhesive-bonding, soldering and sintering.

14. The method of claim 9, wherein
the at least one Schottky diode is at least partially formed by sawing.

15. The method of claim 14, wherein
after the performance of said sawing, said edge region, at least in the region of said Schottky contact is subjected to etching.

16. The method of claim 9,
wherein the method is used to form a plurality of Schottky diodes in the form of a wafer; and
said wafer is arranged on a carrier device, thereby forming a loose assemblage of individual Schottky diodes.

17. The method of claim 16, wherein
said plurality of Schottky diodes are completely singulated after the passivation layer has been arranged.

* * * * *